US006869336B1

(12) United States Patent
Hardikar

(10) Patent No.: US 6,869,336 B1
(45) Date of Patent: Mar. 22, 2005

(54) METHODS AND COMPOSITIONS FOR CHEMICAL MECHANICAL PLANARIZATION OF RUTHENIUM

(75) Inventor: Vishwas V. Hardikar, Phoenix, AZ (US)

(73) Assignee: Novellus Systems, Inc., Chandler, AZ (US)

( * ) Notice: Subject to any disclaimer, the term of this patent is extended or adjusted under 35 U.S.C. 154(b) by 0 days.

(21) Appl. No.: 10/666,140

(22) Filed: Sep. 18, 2003

(51) Int. Cl.[7] .................................................. B24B 1/00
(52) U.S. Cl. .................... 451/41; 451/28; 451/36; 451/57; 451/921; 51/306; 252/79.1; 252/79.2; 438/692; 156/653.1
(58) Field of Search ............................. 451/28, 36, 41, 451/60, 57, 63, 285–290, 921; 252/79.1–79.3; 51/307–309; 438/690, 692, 693; 156/653.1, 654.1

(56) References Cited

U.S. PATENT DOCUMENTS

| | | | | |
|---|---|---|---|---|
| 5,527,423 A | * | 6/1996 | Neville et al. | 438/693 |
| 5,691,219 A | * | 11/1997 | Kawakubo et al. | 438/253 |
| 5,693,239 A | * | 12/1997 | Wang et al. | 216/88 |
| 5,958,794 A | * | 9/1999 | Bruxvoort et al. | 438/692 |
| 6,126,853 A | * | 10/2000 | Kaufman et al. | 252/79.1 |
| 6,146,244 A | * | 11/2000 | Atsugi et al. | 451/36 |
| 6,293,848 B1 | * | 9/2001 | Fang et al. | 451/36 |
| 6,527,622 B1 | | 3/2003 | Brusic et al. | |
| 2003/0139116 A1 | | 7/2003 | Moegganborg et al. | |

OTHER PUBLICATIONS

Kevin Moeggenborg, et al., "Development of Planarization Process for Nontraditional Materials: Noble Metals CMP", CMP–MIC Conference, Mar. 7–8, 2001, pp. 150–156.

Oliver Chyan, et al., "Ruthenium–based Copper Diffusion Barrier: Studied by Electrochemistry, SIMS Depth Profiling and Sheet Resistance Measurements", The Electrochemical Society, Inc. 2003.

Oliver Chyan, et al., "Electrodeposition of Copper Thin Film on Ruthenium, A Potential Diffusion Barrier for Cu Interconnects", Journal of the Electrochemical Society, vol. 150, No. 5 (2003).

* cited by examiner

Primary Examiner—Joseph J. Hail, III
Assistant Examiner—Anthony Ojini
(74) Attorney, Agent, or Firm—Ingrassia Fisher & Lorenz PC

(57) ABSTRACT

Methods and compositions are provided for the chemical mechanical planarization of ruthenium. The method includes polishing the ruthenium layer using a low contact pressure and exposing the ruthenium layer to a planarization composition while polishing. The planarization composition comprises a dispersing medium and a plurality of abrasive particles. The method further includes removing the ruthenium of the ruthenium layer as a ruthenium hydroxide if the pH of the composition is in the range of from about 8 to about 12. The planarization composition may further comprise an oxidizing agent, with the ruthenium removed as a ruthenium hydroxide if the pH of the composition is in the range of from about 2 to about 14. The planarization composition may further comprise a complexing agent, with the ruthenium transformed into an ionic state and removed as a ruthenium complex if the pH of the composition is no greater than about 2.5.

9 Claims, 2 Drawing Sheets

METHODS AND COMPOSITIONS FOR CHEMICAL MECHANICAL PLANARIZATION OF RUTHENIUM

TECHNICAL FIELD

The present invention generally relates to chemical mechanical polishing of metal layers, and more particularly relates to methods and compositions for chemical mechanical polishing of ruthenium layers.

BACKGROUND

The production of integrated circuits begins with the creation of high-quality semiconductor wafers. During the wafer fabrication process, the wafers may undergo multiple dielectric and conductor deposition processes followed by the masking and etching of the deposited layers. Some of these steps relate to metallization, which generally refers to the materials, methods and processes of wiring together or interconnecting the component parts of an integrated circuit located on or overlying the surface of the wafer. Typically, the "wiring" of an integrated circuit involves etching features, such as trenches and "vias," in a planar dielectric (insulator) layer and filling the features with a conductive material, typically a metal.

In the past, aluminum was used extensively as a metallization material in semiconductor fabrication due to ease with which aluminum could be applied and patterned and due to the leakage and adhesion problems experienced with the use of gold. Other metallization materials have included such materials as Ni, Ta, Ti, W, Ag, Cu/Al, TaN, TiN, CoWP, NiP and CoP, alone or in various combinations.

Recently, techniques have been developed which utilize copper to form conductive contacts and interconnects because copper is less susceptible to electromigration and exhibits a lower resistivity than aluminum. Since copper does not readily form volatile or soluble compounds, the patterned etching of copper is difficult, and the copper conductive contacts and interconnects are therefore often formed using a damascene process. In accordance with the damascene process, the copper conductive contacts and interconnects are usually formed by creating a via within an insulating material. A barrier layer, which serves to prevent catastrophic contamination caused by copper diffusing through the interlayer dielectrics, may be deposited onto the surface of the insulating material and into the via. Because it is often difficult to form a copper metallization layer overlying the barrier layer, a seed layer of copper may be deposited onto the barrier layer. Then, a copper metallization layer is electrodeposited onto the seed layer to fill the via. The excess copper metallization layer, the copper seed layer, and the barrier layer overlying the insulating material then may be removed, for example by a process of chemical mechanical planarization or chemical mechanical polishing, each of which will hereafter be referred to as chemical mechanical planarization or CMP.

Barrier layers formed of tantalum (Ta) and tantalum nitride (TaN) currently are used to contain copper interconnects. However, it is difficult to deposit copper effectively onto thin barrier layers of Ta/TaN because the layers generally are too resistive, especially in high-aspect ratio features. In addition, it is difficult to fill high-aspect ratio features with copper due to the occurrence of copper voids. Poor sidewall coverage and large overhang surrounding the features cause the copper electrofill to close off and leave void defects in the features. As integrated circuits continue to scale to 90 nm nodes, 65 nm nodes, 45 nm nodes and smaller, it may become difficult to further decrease the dimensions of the Ta/TaN/Cu trilayer in higher-aspect ratio features. Preferable barrier layers should demonstrate good adhesion to both copper and interlayer dielectric materials, in addition to affording a conductive copper-plating platform that allows for the bottom-up copper electrofill of damascene features. Accordingly, as the aggressive scaling of semiconductor device dimensions continues, it is highly desirable to use a copper-plateable single-layer barrier layer for use in interconnects applications.

Barrier layers formed of ruthenium may present a desirable alternative to Ta/TaN barriers. Ruthenium is an air-stable transition metal with a high melting point and is nearly twice as thermally and electrically conductive as tantalum. In addition, ruthenium, like tantalum, generally shows negligible solid solubility with copper. However, ruthenium presents a particular challenge during CMP, as ruthenium is mechanically hard (Mohs hardness of approximately 6.5) and chemically resistant.

Accordingly, it is desirable to provide an improved method for the chemical mechanical planarization of ruthenium. In addition, it is desirable to provide improved chemical mechanical planarization compositions for removing ruthenium from a work piece. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

The invention disclosed and claimed herein is directed to the chemical mechanical planarization of a ruthenium layer overlying a work piece. The invention is applicable to the planarization of a surface of a variety of work pieces, but will be described and illustrated with reference to only a single illustrative work piece, namely a semiconductor wafer having a layer of ruthenium deposited thereon. Although the invention is illustrated with reference to its application only to one particular work piece and to one particular metal deposited on that work piece, it is not intended that the invention be limited to that particular application.

In accordance with an exemplary embodiment of the present invention, a method for chemical mechanical planarization of a work piece having a ruthenium layer thereon comprises polishing the ruthenium layer while concurrently exposing the ruthenium layer to a planarization composition.

The planarization of the ruthenium layer can be accomplished in a CMP apparatus such as a Momentum CMP apparatus available from Novellus Systems Inc., CMP division, of Chandler, Ariz. A representative CMP apparatus 10 with which the planarization can be carried out is schematically illustrated, in cross section, in FIG. 1. This apparatus is merely exemplary of CMP apparatus that can be employed in carrying out a CMP process in accordance with various embodiments of the invention and it will be appreciated that any other suitable CMP apparatus may be used.

Figure 1:
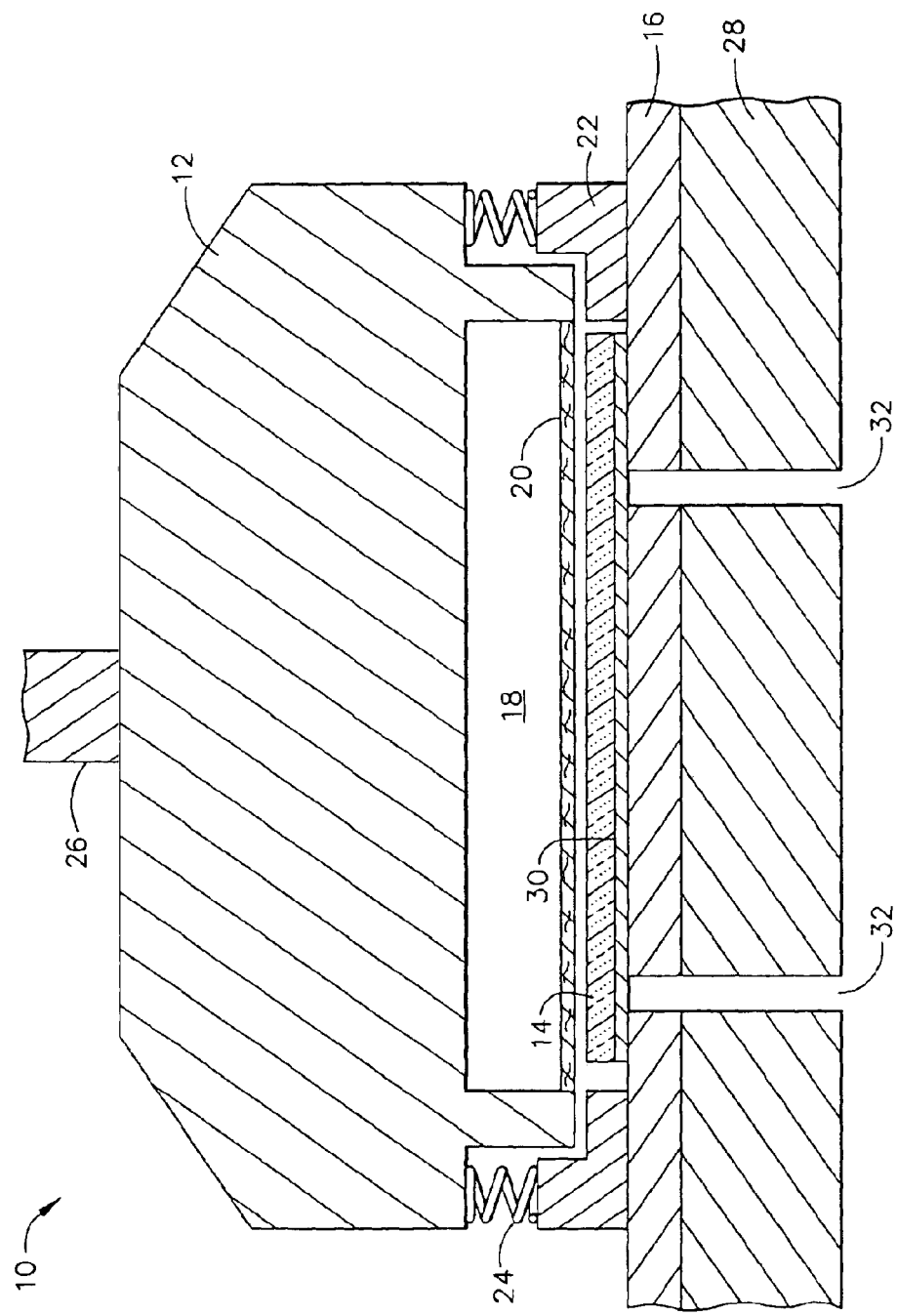
FIG. 1 illustrates schematically, in cross section, an apparatus in which a work piece can be planarized in accordance with an embodiment of the invention.

Referring to FIG. 1, CMP apparatus 10 includes a carrier head 12 for controllably pressing a semiconductor wafer 14 having a ruthenium layer 30 on a front surface thereof against a contact surface, such as a polishing pad 16. Carrier head 12 includes a rigid casing having a cavity 18 on a lower surface. A flexible membrane 20 is stretched across the cavity and presses against the back surface of the semiconductor wafer. A wear ring 22 is attached to the rigid carrier head with a resilient attachment here illustrated by springs 24. The wear ring surrounds cavity 18 and serves to precondition the polishing pad and to contain the lateral movement of the semiconductor wafer, thus maintaining the semiconductor wafer in position on the underside of carrier head 12. Carrier head 12 is attached to a shaft 26 by means of which the correct downward pressure can be applied to the carrier head and hence between the semiconductor wafer and the polishing pad. In a preferred embodiment of the invention, the downward pressure applied to the semiconductor wafer by the polishing pad is a low down force, that is, a contact pressure in the range of from about 0.1 to about 4.0 psi. A low down force in this range will result in a controllable removal rate of the ruthenium while reducing or preventing the likelihood of damage to an underlying insulative layer such as a low-k dielectric material, that is, having a dielectric constant in the range of about $2<k\leq3.9$ or an ultra-low-k dielectric material, that is, having a dielectric constant no greater than about 2. While CMP apparatus 10 illustrates a method for planarization during which wafer 14 is pressed down against polishing pad 16, it will be appreciated that CMP apparatus 10 could be configured so that polishing pad 16 is pressed down against wafer 14. Accordingly, the term "contact pressure" shall refer to the pressure exerted on semiconductor wafer 14 by polishing pad 16, regardless of the position of the polishing pad relative to the wafer. Further, the term "low contact pressure" shall mean a contact pressure in the range of from about 0.1 to about 4 psi. Shaft 26 also may be used to impart a rotational motion to carrier head 12 to improve the uniformity of the polishing action. Polishing pad 16 is mounted on a platen 28. Polishing pad 16 may comprise any suitable contact surface used to impart pressure on a surface of wafer 14 to facilitate the planarization thereof. In accordance with one embodiment of the invention, polishing pad 16 may be a polishing pad such as an IC 1000 available from Rodel, Inc. of Newark Del.

Platen 28 may be connected to a driver or motor assembly (not shown) that is operative to rotate platen 28 and polishing pad 16 about a vertical axis. It will be appreciated, however, that the driver or motor assembly may be operative to move platen 28 and polishing pad 16 in an orbital, linear or oscillatory pattern or any combination thereof. Similarly, carrier head 12 and shaft 26 may be connected to a driver or motor assembly (not shown) that is operative to rotate carrier head 12 and semiconductor wafer 14 about a vertical axis or to move carrier head 12 and semiconductor wafer 14 in an orbital, linear or oscillator pattern or any combination thereof.

Platen 28 may have one or more channels 32 for the transportation of the planarization composition of the present invention to the surface of polishing pad 16 from a manifold apparatus (not shown) or any suitable distribution system. Alternatively, it will be appreciated that the planarization composition of the present invention may be deposited directly on or through the polishing pad by a conduit or any suitable application mechanism.

Figure 2:
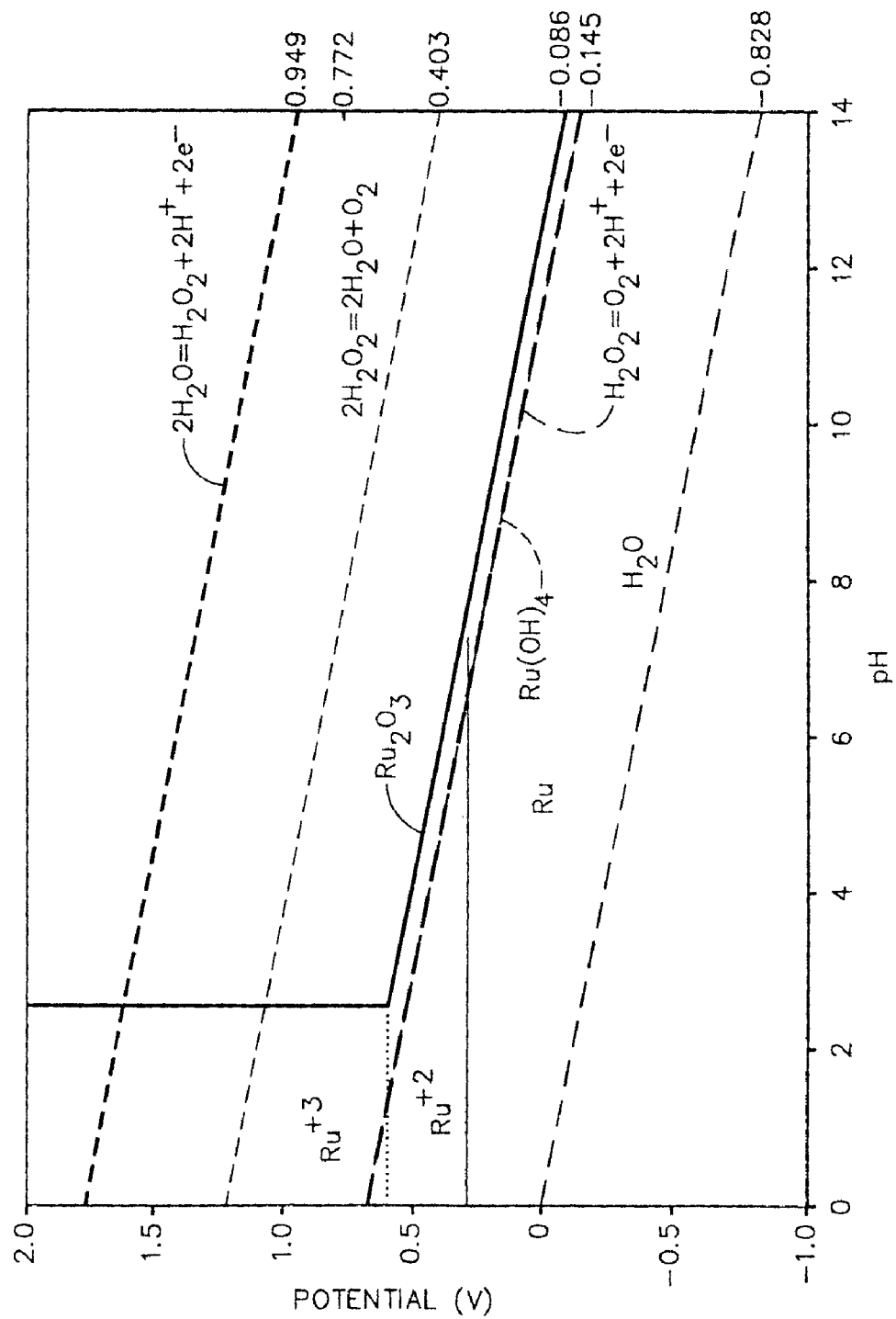
FIG. 2 is a Pourbaix diagram for a ruthenium-water-peroxide system.

The planarization compositions of the exemplary embodiments of the present invention take advantage of the various species of ruthenium, such as those illustrated in FIG. 2. FIG. 2 is a Pourbaix diagram for a ruthenium-water-peroxide system. As illustrated in FIG. 2, in a ruthenium-water system at an alkaline pH, that is, a pH in the range of about 8 to about 12, the electrochemical potential of the ruthenium-water system is such that ruthenium may be removed from a ruthenium layer as a hydroxide species, such as, for example, $Ru(OH)_4$. At a pH in the range of about 2.5 to about 14, if a sufficient amount of peroxide, an oxidizing agent, is added to the system, the electrochemical potential of ruthenium is increased and ruthenium may be removed from a ruthenium layer as an oxide species, such as, for example, $Ru_2O_3$. At a pH no greater than about 2.5, if the electrochemical potential of ruthenium is sufficiently increased, such as by the addition of peroxide, ruthenium may exist as an ionic species, that is, $Ru^{+2}$ and/or $Ru^{+3}$. The ionic ruthenium species then may be removed as a complex when combined with a suitable complexing agent. While the Pourbaix diagram of FIG. 2 illustrates a ruthenium-water-peroxide system, the system illustrated is not limited to the use of peroxide. Rather, the same diagram may result with the use of any similar oxidizing agent.

Accordingly, in accordance with one exemplary embodiment of the present invention, the planarization composition may be formulated so that ruthenium of a ruthenium layer of a semiconductor wafer is removed as a ruthenium hydroxide. The planarization composition may comprise a dispersing medium and a plurality of abrasive particles. The dispersing medium serves to distribute the abrasive particles, and any other suitable polishing additive that comprises the planarization composition, as described in more detail below, to the surface of the ruthenium layer. The dispersing medium preferably is an aqueous liquid, such as, for example, water, or any other suitable dispersing medium, such as an aqueous solution or emulsion.

The abrasives particles of the various embodiments of the planarization composition of the present invention form a uniform, substantially dispersed solution with the dispersing medium. The abrasive particles have a Mohs hardness in the range of about 5 to about 9, preferably in the range of about 6 to about 7, and a particle size in the range of about 20 nms to about 2 microns. As used herein, "particle size" refers to the average size (the size is the average diameter of an abrasive particle) of the plurality of abrasive particles. The planarization composition of the present invention may comprise abrasive particles such as, for example, silica (Mohs hardness of approximately 6.5), titania (Mohs hardness of approximately 5.5 to 6.5), zirconia (Mohs hardness of approximately 6.5), alumina (Mohs hardness of approximately 9) or a combination thereof. In a preferred embodiment of the invention, the abrasive particles may be formed of fumed silica. Further, the abrasive particles form a stable colloid with the dispersing medium, that is, the abrasive particles do not exhibit substantial agglomeration or coagulation and do not readily settle out of solution. The concentration of the abrasive particles may be in the range of about 1 weight percent to about 50 weight percent.

In another embodiment of the present invention, the planarization composition can be formulated to have a pH in the range of from about 8 to about 12. If the dispersing medium/abrasive particles solution has a pH outside of this range, the planarization composition may comprise a suitable pH-adjusting agent to adjust the pH to within this range. Examples of pH adjusting agents suitable for adjusting the pH of the planarization composition to within the range of about 8 to about 12 include, but are not limited to, potassium hydroxide, ammonium hydroxide, tetramethylammonium hydroxide and the like or a combination thereof. At this pH, the planarization composition interacts with the ruthenium surface and promotes its dissolution as a ruthenium hydroxide species.

In another embodiment of the present invention, the planarization composition can be formulated to so that ruthenium is liberated from the ruthenium layer as ruthenium oxide and/or a hydrated ruthenium oxide. In accordance with this embodiment, the planarization composition may comprise a dispersion medium and abrasive particles, such as the dispersion medium and abrasive particles described above. The planarization composition also may have a pH in the range of from about 8 to about 12. If the dispersing medium/abrasive particles solution does not have a pH within this range, the planarization composition may comprise any of the suitable pH-adjusting agents described above to adjust the pH to within this range. The planarization composition of this embodiment further comprises one or more oxidizing agents. The oxidizing agent may comprise any suitable oxidizing agent, such as a peroxide, which is defined as any organic or inorganic compound containing a bivalent O—O group. Examples of suitable oxidizing agents include hydrogen peroxide ($H_2O_2$), peroxysulfuric acid (or persulfuric acid), periodic acid ($HIO_4$ or $H_5IO_2$), monopersulfates ($SO_5^{2-}$), dipersulfates ($S_2O_8^{2-}$), di-tert-butyl peroxide ($C_8H_{18}O_2$) and the like and combinations thereof. In a preferred embodiment of the present invention, the oxidizing agent comprises hydrogen peroxide. The oxidizing agent may be present in the planarizing composition in the range of about 0.001 to about 3M.

In a further embodiment of the present invention, the planarization composition can be formulated so that ruthenium from the ruthenium layer is transformed to an ionic state ($Ru^{+2}$ and/or $Ru^{+3}$) and is liberated from the ruthenium layer as ruthenium complex. In accordance with this embodiment, the planarization composition may comprise a dispersion medium and abrasive particles, such as the dispersion medium and abrasive particles disclosed above. The planarization composition also may have a pH in the range of from about 0 to about 2.5. If the dispersing medium/abrasive particles solution has a pH outside of this range, the planarization composition may comprise a suitable pH-adjusting agent to adjust the pH to a pH within this range. Suitable pH adjusting agents for adjusting the pH of the planarization composition to no greater than 2.5 comprise inorganic and organic acids. Examples of pH adjusting agents suitable for adjusting the pH of the planarization composition to no greater than 2.5 include, but are not limited to, sulfuric acid, hydrochloric acid, nitric acid, perchloric acid, mono-, di- and tri-carboxylic acids, polyhydroxy acids and the like and combinations thereof. This embodiment of the planarization composition further comprises an oxidizing agent, such as the oxidizing agents described above, present in the planarization composition at a concentration at the range of about 0.001 to about 3M.

The planarization composition of this embodiment also may comprise a complexing agent. The complexing agent forms a soluble complex with the $Ru^{+2}$ or $Ru^{+3}$ ionic species, or both ionic species, which facilitates removal of the ruthenium from the semiconductor wafer. The complexing agent may comprise any suitable constituent that is capable of forming a soluble complex with an ionic state of ruthenium. Examples of suitable complexing agents comprise the following: L-2-amino-3-hydroxybutanoic acid (threonine, $C_4H_9NO_3$), iminodiacetic acid (IDA, $C_4H_7NO_4$), N-(2-hydroxyethyl)ethylenedinitrilotriacetic acid (HEDTA, $C_{10}H_{18}N_2O_7$), ethylenedinitrilotetraacetic acid (EDTA, $C_{10}H_{16}N_2O_8$), DL-(methylethylene)dinitrilotetraacetic acid (PDTA, $C_{11}H_{18}N_2O_8$), trans-1,2-cyclohexylenedinitrilotetraacetic acid (CDTA, $C_{14}H_{22}N_2O$), diethylenetrinitrilopentaacetic acid (DTPA, $C_{14}H_{23}N_3O_{10}$), ethylenediamine ($C_2H_8N_2$), 1,2-dihydroxybenzene-3,5-disulfonic acid (Tiron, $C_6H_6O_8S_2$), 1-nitroso-2-naphthol-3, 6-disulfonic acid (Nitroso-R acid, $C_{10}H_7NO_8S_2$), 1,2-di(2-oxole)ethane-1,2-dione dioxime (alpha-Furil dioxime, $C_{10}H_8N_2O_4$), thiocarbamide (Thioura, $CH_4N_2S$), thiosemicarbazide ($CH_5N_3S$), dithiooxamide ($C_2H_4N_2S_2$), hydroxide ion ($OH^-$), hydrogen thiocyanate (thiocyanic acid, CHNS), ammonia ($NH_3$), hydrogen nitrite (Nitrous acid, $HNO_2$), hydrogen sulfate ion (sulfuric acid, $HSO_4^-$), 2-hydroxyphenylpropenoic acid (o-coumaric acid, $C_9H_8O_3$), and 4-phenylthiosemicarbazide ($C_7H_9N_3S$). The complexing agent may be present in the planarization composition at a concentration in the range of from about $10^{-5}$ to about 2M.

It will be appreciated that a complexing agent, such as any of the suitable complexing agents described above, also may be used in the planarizing composition described above that comprises a dispersion medium, abrasive particles, and an oxidizing agent, and having a pH in the range of from about 8 to about 12. Use of a complexing agent in this embodiment may form a complex with the liberated $Ru_2O_3$ and enhance the solubility of the liberated ruthenium.

EXAMPLE 1

The following example demonstrates the effectiveness of the various embodiments of the planarizing composition and the method of chemical mechanical planarization of the present invention on the removal of ruthenium from a semiconductor wafer using low contact pressures. This example should not be construed as in any way limiting the scope of the present invention.

Each of the semiconductor wafers tested comprised 400 angstroms of ruthenium deposited over a titanium nitride insulative layer on a silicon dioxide substrate. The wafers were subjected to CMP using a Momentum CMP apparatus from Novellus Systems, Inc. while exposed to a planarization composition. Each of the planarizing compositions used comprised a water dispersion medium and 30 wt. % of silica abrasives having a hardness of 6.5 and a particle size of 50 nm. The platen and polishing pad of the CMP apparatus were moved orbitally at speeds of 600 rpm, with a flow of the planarization composition at the polishing pad of 175 ml/min. An IC 1000 polishing pad available from Rodel, Inc. was used in the CMP apparatus. The wafers were rotated at velocities in the range of 2–50 rpm and the CMP time for each wafer was 60 seconds. The removal rate of the ruthenium was calculated from the difference in the resistivity of the semiconductor wafer measured before CMP and after CMP. The approximate removal rates of ruthenium from the tested wafers are summarized in Table 1.

TABLE 1

| Wafer | Oxidant | pH | Carrier Pressure | Removal Rate |
|---|---|---|---|---|
| 1 | | 11 | 2.5 psi | 75 ang./min |
| 2 | $H_2O_2$/1 M | 10-11 | 2.5 psi | 150 ang./min |
| 3 | $H_2O_2$/2 M | 10-11 | 2.5 psi | 200 ang./min |
| 4 | $S_2O_8^{-2}$/0.01 M | 10-11 | 2.5 psi | 200 ang./min |
| 5 | $S_2O_8^{-2}$/0.1 M | 10-11 | 2.5 psi | 200 ang./min |
| 6 | $S_2O_8^{-2}$/0.1 M | 10-11 | 1.5 psi | 85 ang./min |

The results demonstrate that, even at low contact pressures, a high removal rate of the ruthenium layer can be achieved using a method of chemical mechanical planarization and a planarizing composition of the present invention.

EXAMPLE 2

The following example demonstrates the effect of the hardness and size of the abrasive particles of the planarizing composition of the present invention when a low contact pressure is used. Each of the semiconductor wafers tested comprised 400 angstroms of ruthenium deposited over a titanium nitride insulative layer on a silicon dioxide substrate. The wafers were subjected to CMP using a Momentum CMP apparatus from Novellus Systems, Inc. while exposed to a planarization composition. Each of the planarizing compositions comprised a water dispersion medium. The platen and polishing pad of the CMP apparatus were moved orbitally at speeds of 600 rpm, with a flow of the planarization composition at the polishing pad of 175 ml/min. An IC 1000 polishing pad available from Rodel, Inc. was used in the CMP apparatus. The wafers were rotated at velocities in the range of 2–50 rpm and the CMP time for each wafer was 60 seconds. The removal rate of the ruthenium was calculated from the difference in the resistivity of the semiconductor wafer measured before CMP and after CMP.

The planarizing composition used to planarize wafer 7 further comprised 30 wt % silica abrasives with a particle size of 50 nm and IDA as a completing agent. The planarizing composition used to planarize wafer 8 comprised 10 wt. % alumina abrasives with a particle size of 140 nm and no complexing agent. The planarizing composition used to planarize wafer 9 comprised 10 wt. % alumina with a particle size of 2 microns and no complexing agent. The approximate removal rates of ruthenium from the tested wafers are summarized in Table 2.

at a suitable rate, the planarization compositions and methods of the present invention further are capable of removing materials that are not as hard as or are as hard as ruthenium, such as, for example, copper. Thus, in accordance with one exemplary embodiment of the present invention, the planarization compositions and methods of the present invention may be used first to remove a copper (or other similarly hard metal) layer and then to remove an underlying ruthenium layer. In accordance with another exemplary embodiment of the present invention, the planarization compositions and methods of the present invention may be used first to remove a ruthenium layer and then may be used to remove an underlying insulating material layer, such as a low-k or ultra-low-k dielectric. In accordance with a further exemplary embodiment of the present invention, the planarization compositions and methods of the present invention may be used first to remove a copper layer, then remove a ruthenium layer underlying the copper layer, followed by removal of a dielectric layer underlying the ruthenium layer. In a preferred embodiment of the invention, the copper, ruthenium and dielectric layers are polished with a polishing selectivity of 1:1:1.

In another embodiment of the present invention, the chemical mechanical planarization process of the present invention may use two or more planarization compositions to remove multiple layers from a semiconductor wafer. For example, a planarization composition of the present invention may be used in a CMP apparatus to remove a ruthenium layer from a semiconductor wafer and a second composition may be used to remove an underlying insulating material layer. Alternatively, a first composition, such as an abrasive-free slurry, may be used to remove a material overlying the ruthenium layer, such as copper, and a planarization compositions of the present invention may be used to planarize the ruthenium layer and any metal remaining thereon.

In another embodiment of the present invention, the various planarization compositions of the present invention may further comprise a passivation agent. The passivation agent may be suitable to reduce or prevent the corrosion of a copper layer overlying the ruthenium layer so as to facilitate planar polishing of the semiconductor wafer. Alternatively, the passivation agent may serve to protect an insulating material layer underlying the ruthenium layer. Any conventional passivation agent known in the semiconductor processing industry may be used in a planarization composition of the present invention and may include, for example, benzotriazole and aromatic heterocyclo compounds.

TABLE 2

| Wafer | Oxidant | pH | Carrier Pressure | Abrasive Particle Type | Abrasive Particle Size | Additives | Removal Rate |
|---|---|---|---|---|---|---|---|
| 7 | $H_2O_2$/1 M | 2 | 2.5 psi | 30 wt. % silica | 50 nm | 0.1 wt. % HCl and 0.1 wt. % IDA | 140 ang./min |
| 8 | $H_2O_2$/1 M | 2 | 2.5 psi | 10 wt. % alumina | 140 nm | 0.1 wt. % HCl | None |
| 9 | $H_2O_2$/1 M | 2 | 2.5 psi | 10 wt. % alumina | 2 microns | 0.1 wt. % HCl | 85 ang./min |

The results demonstrate that, even at low contact pressures, a high removal rate of the ruthenium layer can be achieved using the method of chemical mechanical planarization and the planarizing composition of the present invention.

It will be appreciated that, because the planarization compositions and methods of the present invention are capable of removing ruthenium, which is a relatively hard metal (Mohs hardness of 6.5), from a semiconductor wafer While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A planarization composition for chemical mechanical planarization using low contact pressures to remove ruthenium from a work piece, the composition comprising:

a dispersing medium; and a plurality of abrasive particles dispersed in said dispersing medium, said abrasive particles having a Mohs hardness in the range of about 5 to about 9 and a particle size in the range of about 20 nm to about 2 microns, said plurality of abrasive particles comprising about 1 to 50 wt. percent of the composition;

wherein said planarization composition has a pH in the range of about 8 to about 12 and wherein said planarization composition causes the ruthenium to be removed from the work piece as a ruthenium hydroxide.

2. The planarization composition of claim 1, wherein said plurality of abrasive particles are formed from at least one material selected from the group comprising silica, alumina, zirconia, and titania.

3. A planarization composition for chemical mechanical planarization using low contact pressures to remove ruthenium from a work piece, the composition comprising:

a dispersing medium;

a plurality of abrasive particles dispersed in said dispersing medium, wherein said abrasive particles having a Mohs hardness in the range of about 5 to about 9 and a particle size in the range of about 20 nm to about 2 microns, and wherein said plurality of abrasive particles comprising about 1 to 50 wt. percent of the composition; and an oxidizing agent;

wherein said planarization composition causes the ruthenium to be removed from the work piece as a ruthenium oxide when said planarization composition has a pH in the range of about 2.5 to about 14.

4. The planarization composition of claim 3, wherein said plurality of abrasive particles is formed from at least one material selected from the group comprising silica, alumina, zirconia, and titania.

5. The planarization composition of claim 3, wherein said oxidizing agent is selected from the group comprising hydrogen peroxide, peroxysulfuric acid, periodic acid, monopersulfates, dipersulfates, and di-tert-butyl peroxide.

6. A planarization composition for chemical mechanical planarization using low contact pressures to remove ruthenium from a work piece, the composition comprising:

a dispersing medium;

a plurality of abrasive particles colloidally dispersed in said dispersing medium, wherein said abrasive particles having a Mohs harness in the range of about 5 to about 9 and a particle size in the range of about 20 nm to about 2 microns, and wherein said plurality of abrasive particles comprising about 1 to 50 wt. percent of the composition;

an oxidizing agent; and a complexing agent, wherein said planarization composition causes the ruthenium to be transformed to an ionic state and the ionic ruthenium to be removed as a ruthenium complex when the planarization composition has a pH no greater than about 2.5.

7. The planarization composition of claim 6, wherein said plurality of abrasive particles is formed from at least one material selected from the group comprising silica, alumina, zirconia, and titania.

8. The planarization composition of claim 6, wherein said oxidizing agent is selected from the group comprising hydrogen peroxide, peroxysulfuric acid, periodic acid, monopersulfates, dipersulfates, and di-tert-butyl peroxide.

9. The planarization composition of claim 6, wherein said step complexing agent selected from the group comprising L-2-amino-3-hydroxybutanoic acid (threonine, $C_4H_9NO_3$), iminodiacetic acid (IDA, $C_4H_7NO_4$), N-(2-hydroxyethyl) ethylene-dinitrilotriacetic acid (HEDTA, $C_{10}H_{18}N_2O_7$), ethylenedinitrilo-tetraacetic acid (EDTA, $C_{10}H_{18}N_2O_8$), DL-(methylethylene)dinitrilotraacetic acid (PDTA, $C_{14}H_{22}N_2O_8$), trans-1,2-cyclohexylenedinitrilotetraacetic acid (CDTA, $C_{14}H_{22}N_2O_8$), diethylenetrinitrilopentaacetic acid (DTPA, $C_{14}H_{23}N_3O_{10}$), ethylenediamine ($C_2H_8N_2$), 1,2-dihydroxybenzene-3,5-disulfonic acid (Tiron, $C_6H_8O_8S_2$), 1-nitroso-2-naphthol-3,6-disulfonic acid (Nitroso-R acid, $C_{10}H_7NO_8S_2$), 1,2-di(2-oxole)ethane-1,2-dione dioxime (alpha-Furil dioxime, $C_{10}H_8N_2O_4$), thiocarbamide (Thioura, $CH_4N_2S$), thiosemicarbazide ($CH_5N_3S$), dithiooxamide ($C_2H_4N_2S_2$), hydroxide ion ($OH^-$), hydrogen thiocyanate (thiocyanic acid, CHNS), ammonia ($NH_3$), hydrogen nitrite (Nitrous acid, $HNO_2$), hydrogen sulfate ion (sulfuric acid, $HSO_4^-$), 2-hydroxyphenylpropenoic acid (o-coumaric acid, $C_9H_8O_3$), and 4-phenylthiosemicarbazide ($C_7H_9N_3S$).

* * * * *

UNITED STATES PATENT AND TRADEMARK OFFICE
CERTIFICATE OF CORRECTION

| | | |
|---|---|---|
| PATENT NO. | : 6,869,336 B1 | Page 1 of 1 |
| APPLICATION NO. | : 10/666140 | |
| DATED | : March 22, 2005 | |
| INVENTOR(S) | : Vishwas V. Hardikar | |

It is certified that error appears in the above-identified patent and that said Letters Patent is hereby corrected as shown below:

On the title page after (73) Assignee: Novellus Systems, Inc., delete "Chandler, AZ" and add -- San Jose, CA --.

In Column 10, line 33, please delete "$C_{10}H_{18}N_2O_8$" and add -- $C_{10}H_{16}N_2O_8$ --.

In Column 10, line 35, please delete "$C_{14}H_{22}N_2O_8$" and add -- $C_{11}H_{18}N_2O_8$ --.

In Column 10, line 39, please delete "$C_6H_8O_8S_2$" and add -- $C_6H_6O_8S_2$ --.

Signed and Sealed this

Twenty-fifth Day of December, 2007

JON W. DUDAS
*Director of the United States Patent and Trademark Office*